United States Patent [19]

Sadinsky

[11] Patent Number: 5,424,691
[45] Date of Patent: Jun. 13, 1995

[54] APPARATUS AND METHOD FOR ELECTRONICALLY CONTROLLED ADMITTANCE MATCHING NETWORK

[76] Inventor: Samuel Sadinsky, 42-46 249th St., Little Neck, N.Y. 11363-1673

[21] Appl. No.: 192,296
[22] Filed: Feb. 3, 1994
[51] Int. Cl.⁶ .......................................... H03H 7/40
[52] U.S. Cl. ................................. 333/17.3; 334/12
[58] Field of Search ..................... 333/17.3, 99 PL; 334/11, 12, 14, 71

[56] References Cited

U.S. PATENT DOCUMENTS

| | | | |
|---|---|---|---|
| 3,995,237 | 11/1976 | Brunner | 333/17.3 |
| 4,112,395 | 9/1978 | Seward | 333/17.3 |
| 4,201,960 | 5/1980 | Skutta et al. | 333/17.3 |
| 4,209,758 | 6/1980 | Snedkerud et al. | 333/17.3 |
| 4,233,561 | 11/1980 | Haddon et al. | 324/326 |
| 4,311,972 | 1/1982 | Landt et al. | 333/17.3 |
| 4,356,458 | 10/1982 | Armitage | 333/17.3 |
| 4,375,051 | 2/1983 | Theall | 333/17.3 |
| 4,485,360 | 11/1984 | Seward | 333/17.3 |
| 4,493,112 | 1/1985 | Bruene | 333/17.3 X |
| 4,612,669 | 9/1986 | Nossen | 455/284 |
| 4,621,242 | 11/1986 | Theall, Jr. et al. | 333/17.3 |
| 4,630,013 | 12/1986 | Takada | 334/12 |
| 4,679,007 | 7/1987 | Reese et al. | 333/17.3 |
| 4,882,541 | 11/1989 | Haragashira | 324/322 |
| 4,951,009 | 8/1990 | Collins | 333/17.3 |
| 5,053,725 | 10/1991 | Gesche et al. | 333/17.3 |
| 5,187,454 | 2/1993 | Collins et al. | 333/17.3 |
| 5,195,045 | 3/1993 | Keane et al. | 364/482 |

OTHER PUBLICATIONS

Bruene, "An Inside Picture of Directional Wattmeters", QST, Apr. 1959, pp. 24-28.

Primary Examiner—Paul Gensler

[57] ABSTRACT

An apparatus for dynamically matching a radio-frequency source for semiconductor processing to a load, and particularly adapted for plasma sputtering and etching processes, comprises an admittance matching network utilizing magnetically saturable inductors. A dc bias signal is provided to optimize the operating point of the saturable reactor with respect to the hysteresis characteristic of the core material. A control signal characterized by a phase error and a magnitude derived from the signal reflected from the load is applied to control the magnetizing current flowing through the inductors. The invention discloses a structure for the inductors which provides efficient coupling of the control current, while inherently rejecting rf currents reflected back from the load to the inductor current source.

16 Claims, 15 Drawing Sheets

APPARATUS AND METHOD FOR ELECTRONICALLY CONTROLLED ADMITTANCE MATCHING NETWORK

BACKGROUND OF THE INVENTION

1. Field of the Invention

The invention relates to electronic admittance matching networks, and more particularly, to an admittance matching network utilizing a saturable inductor and adapted for matching a radio frequency power source to a variable impedance load such as a gas plasma.

2. Description of the Prior Art

Matching networks are used, particularly in radio frequency applications, for matching the impedance or admittance of a power source to a load having a different impedance or admittance in order to provide maximum power transfer to the load and to preclude damage to the power source from reflected energy due to the mismatch. Such applications include, for example, matching radio frequency amplifiers to an antenna and semiconductor processing apparatus, such as used for sputter deposition of thin films and gas plasma or reactive ion etching to etch conductive patterns on semiconductor wafers.

Apparatus for deposition and etching of semiconductors are widely used in industry. Efficient operation at the relatively high power levels utilized requires that the signal source be admittance matched to the load to be processed. Conventional gas plasma chambers, for example, present a variable admittance to the power source, depending on the processing parameters and the stage of processing. Since efficient power transfer requires providing at least an approximate match between the power source and the load, prior art systems have introduced a matching network having variable impedance parameters which readjusted during the process to maintain an impedance or admittance match.

Prior art matching networks have relied on mechanically varying a plurality of capacitors or inductors, which suffers from slow response and lack of mechanical reliability. One such system utilizes a saturable reactor in solenoidal form as the variable element. However, the solenoid is an inefficient element for this application, as it is an open magnetic circuit with high flux losses. Another application suggests to utilize a toroidal configuration, but toroidal windings are not feasible for the large diameter transmission lines required at the usual power levels, and the close coupling of the windings permits high voltage breakdown and transfer of rf energy to the inductor current supply.

Other prior art deals with methods of sensing and adjusting the variable inductor in response to changing load conditions, but may require complex and expensive circuitry.

The present invention provides a simple, cost effective structure for admittance matching, permitting dynamic control under varying load conditions typical of semiconductor processing apparatus, and wholly electronic in nature. The invention will be described with respect to the accompanying drawings, in which like reference numerals refer to like or similar elements.

SUMMARY OF THE INVENTION

Figure 1:
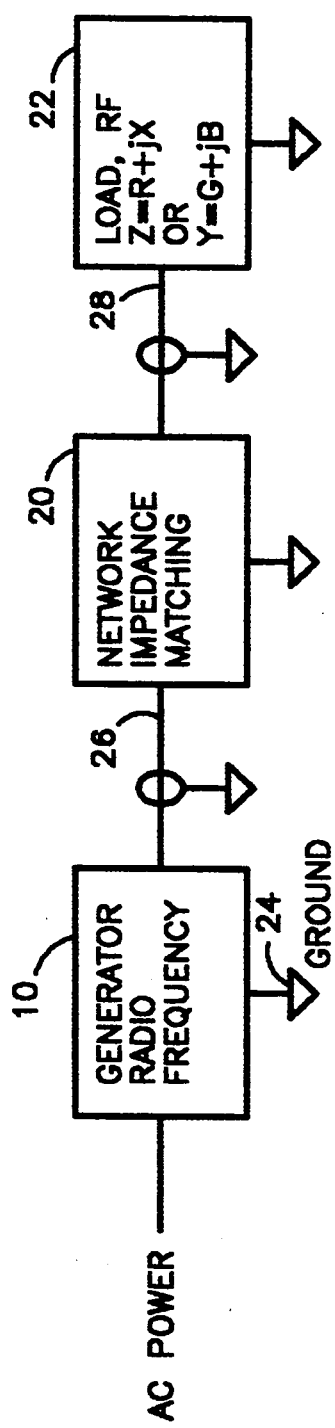
FIG. 1 shows a block diagram of an impedance matching network interposed between an rf power source and a load.

The present invention provides a method and apparatus for dynamically and electronically matching a radio frequency signal source having a characteristic admittance to a plasma load having a variable admittance. It comprises an admittance matching network wherein a plurality of electronically variable saturable inductors are responsive to a control current. A power monitor provides signals representative of the mismatched condition to a detection circuit, which generates phase error and amplitude error signals corresponding to the degree of mismatch. The generated signals are applied to a current control amplifier which provides a dc current to the variable inductors, whereby the network is urged to provide a predetermined admittance match coinciding with the signal source admittance.

In a preferred embodiment, the inductors are comprised of an E-core assembly on which is wound an rf coil and a plurality of stacked dc magnetizing windings, whereby the use of a large diameter rf conductor is facilitated, while inhibiting voltage breakdown and transfer of rf energy to the current control amplifier. The invention further provides for biasing the inductors so as to provide operation on an optimal portion of the hysteresis curve, whereby the dynamic range is extended.

DESCRIPTION OF THE PREFERRED EMBODIMENT

It will be appreciated as shown in the drawings that the present invention is directed to admittance matching between a signal source and a load, the load typically being a plasma apparatus and the signal source being an rf amplifier. Further, it is usual for such apparatus to be tuned to a frequency of 13.56 Mhz or a multiple thereof. Conventionally the signal source is designed to work into a 50-ohm load. Any admittance mismatch between the rf conductor or the plasma chamber with respect to the signal source will result in a portion of the applied rf energy to be reflected back to the source, resulting in less power effectively applied to the sample being processed in the chamber, and power losses due to heating in the transmission line.

A matching network 20 as shown in FIG. 1 disposed between the rf power source 10 and the load 22 is used to optimize power transfer and to avoid power losses. Signal generator 10 which provides a power output of the order of several kw is connected via a suitable coaxial rf transmission line 26 to impedance matching network 20. Transmission line 28, connecting between network 20 and rf load 22, may be comprised of an enclosed conductor such as copper tubing. Where there is a substantial distance between generator 10 and network 20, a coaxial structure capable of handling the high circulating currents that result from the reactive load should be used.

An rf plasma load 22 may be approximated by an impedance Z comprised of a capacitive reactance jX and a series resistor R, shunted by a diode $D_p$. A more useful representation is an equivalent admittance Y comprised of a conductance G and susceptance jB in parallel with diode $D_p$.

Figure 2:
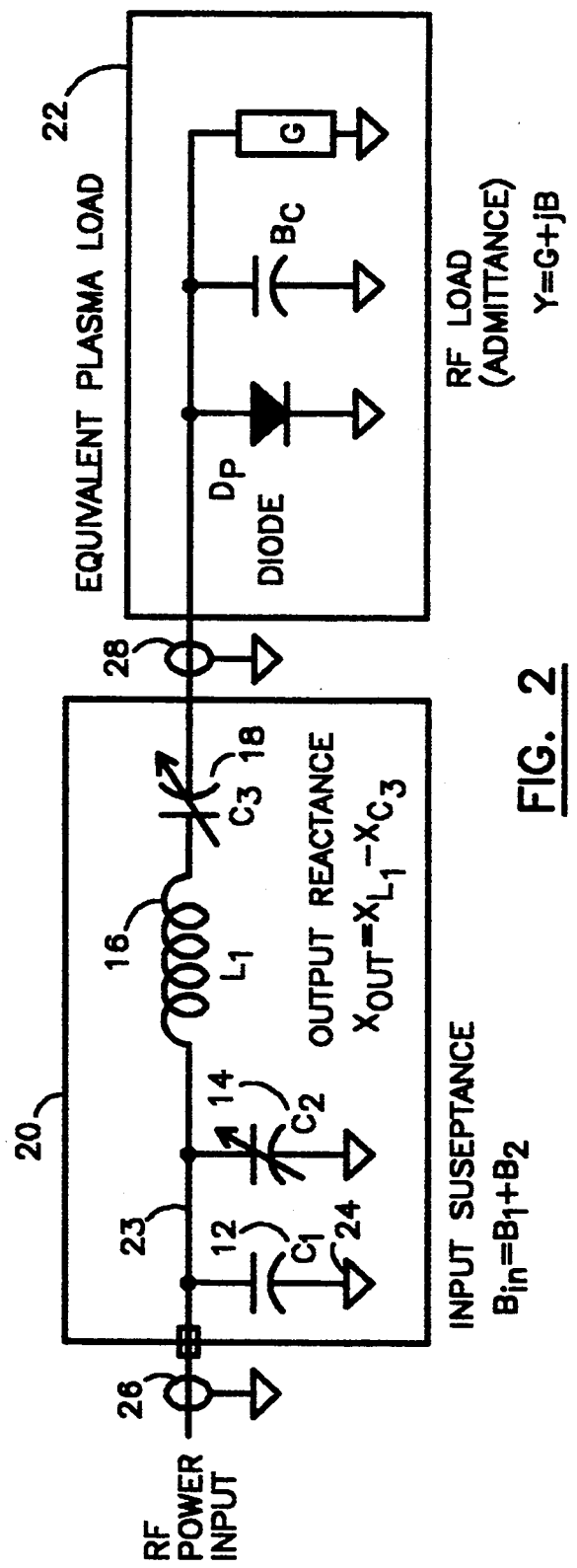
FIG. 2 is circuit diagram of a prior art impedance matching network coupled to a gas plasma load.

Referring now to FIG. 2, there is shown in schematic form the constituent elements of FIG. 1 as employed in the prior art. Matching network 20 is provided with a fixed capacitor 12 coupled to rf conductor line 23 and in parallel with a first variable capacitor 14. Rf conductor line 23 is an integral extension of series inductor 16. Inductor 16 may be fixed or variable, and is coupled in series with a second variable capacitor 18. Shunt circuit elements are returned to a massive ground plane, denoted by reference numeral 24.

The equivalent circuit of plasma load 22 is seen to be comprised of a conductance G, capacitive admittance $B_c$, and diode $D_p$, all in parallel.

By suitably adjusting the variable circuit elements, the characteristic admittance of signal source 10 is matched to the operating admittance of load 22. Since the inherent admittance of the load 22 is variable, the network must be able to compensate over a wide range of complex admittances. Capacitor 18 serves as both a dc potential block and rf variable impedance. The reactance of capacitor 18 is designed to be less than the inductive reactance of inductor 16. Since these two elements are connected in series, the total reactance will be inductive. The residual inductive reactance may now be resonated by the input capacitors 12 and 14. Capacitors 14 and 18 may be manually adjusted or can be motor driven.

Figure 3:
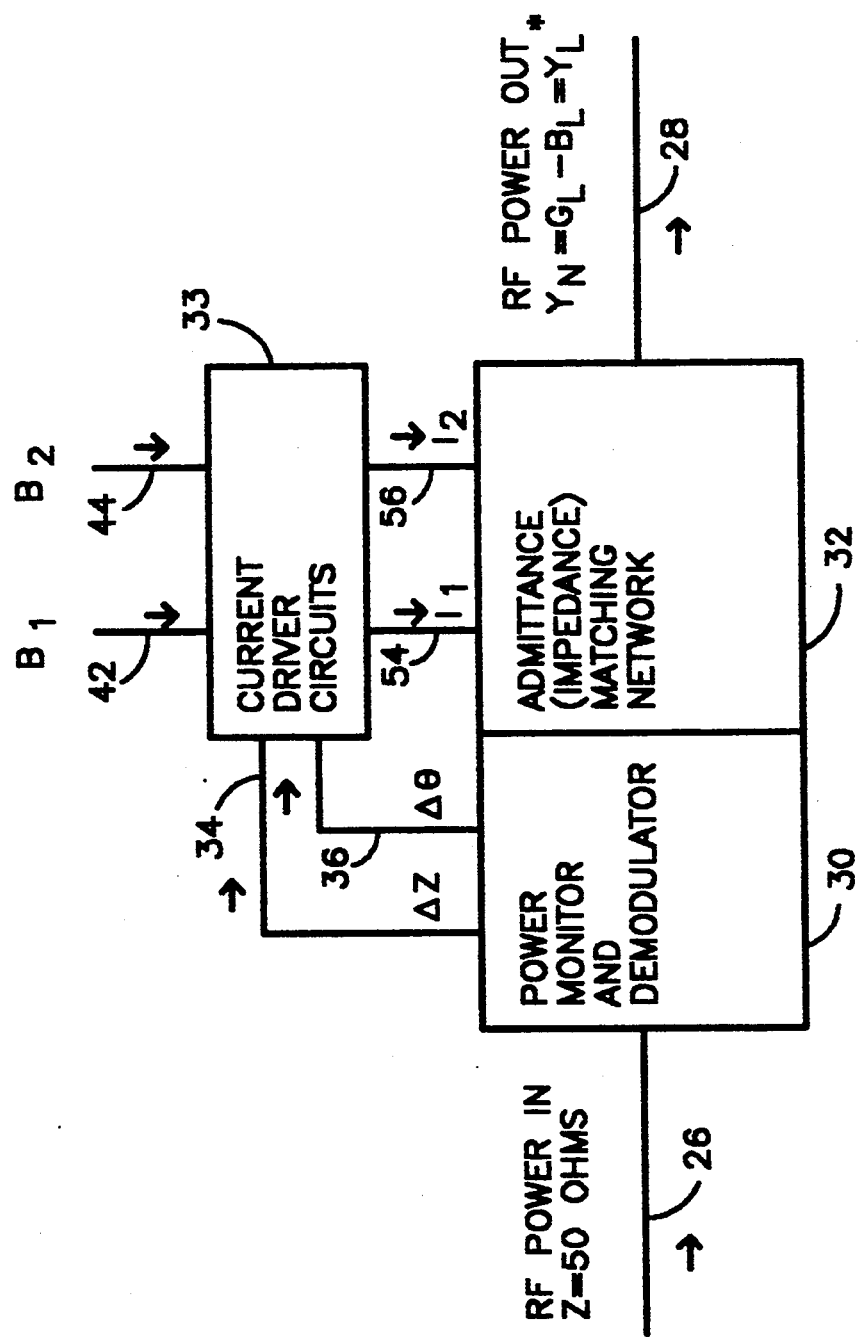
FIG. 3 is a block diagram of an admittance matching apparatus according to the present invention.

Referring now to FIG. 3, there is shown a block diagram of a preferred embodiment of the invention, wherein each of the circuit elements is to be described in further detail in conjunction with the accompanying drawings. Radio frequency power is applied on transmission line 26 to a power monitor and demodulator 30. Monitor/demodulator 30 provides control signals 34 and 36 to current driver block 33. Driver 33 is responsive to bias signals 42 and 44 and provides amplified outputs 54 and 56 to admittance matching network 32. Power monitor/demodulator 30 is coupled to admittance matching network 32 and thereby adjusts the network's output impedance $Y_N$ to a value equal to the complex conjugate $Y_L$ of the load admittance; hence, $Y_N = Y_L^*$.

Figure 4:
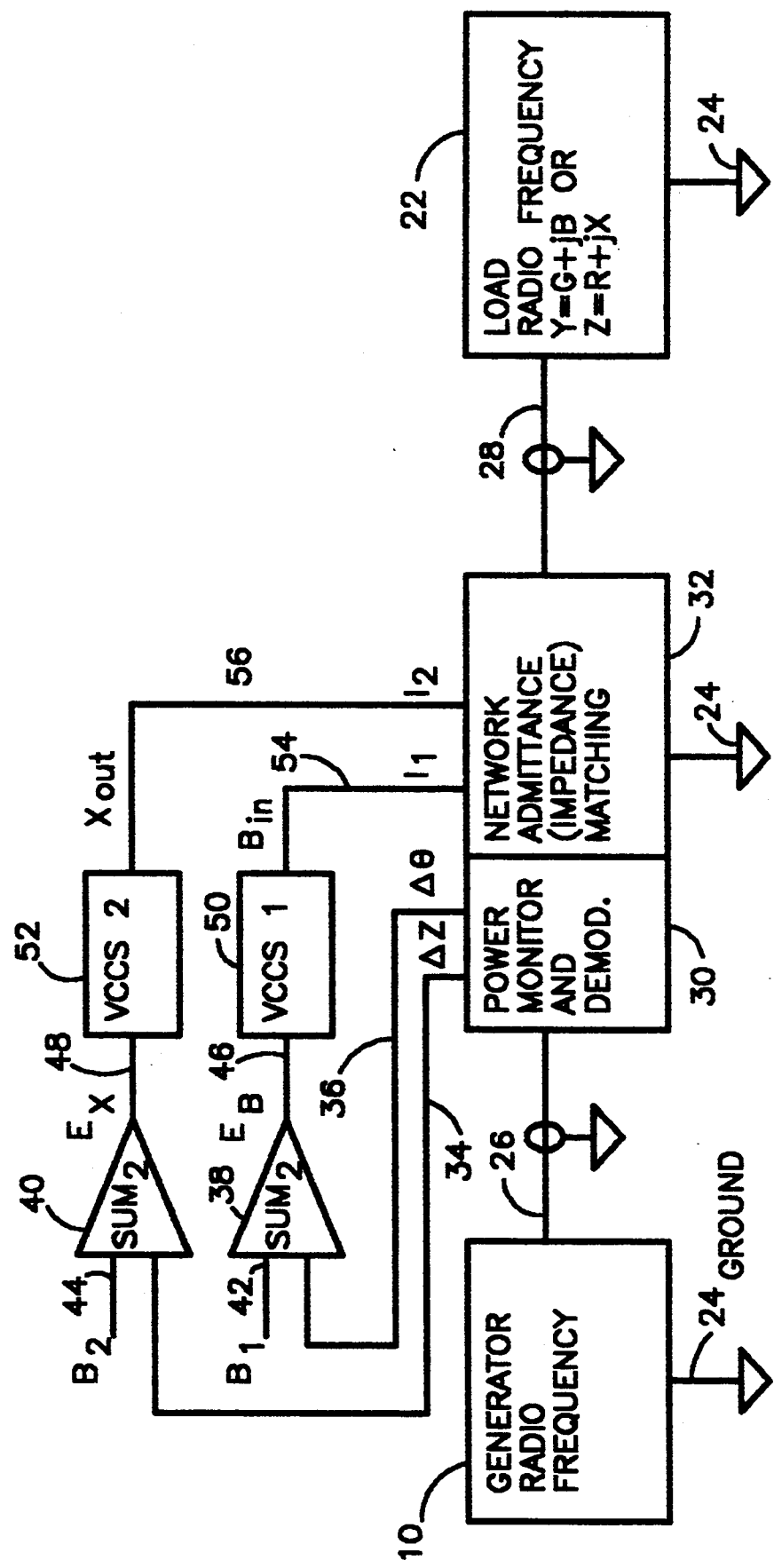
FIG. 4 is a block diagram in accordance with FIG. 3 showing an implementation of an inductor control circuit in accordance with a preferred embodiment of the present invention.

As shown further in FIG. 4, rf generator 10 is coupled via transmission line 26 to power monitor/demodulator 30. Power monitor/demodulator 30 is coupled to network 32 to sense the mismatch condition and produces control signals $\Delta Z$ and $\Delta \Theta$ on leads 34 and 36, respectively. Bias signal B1 on lead 42 is summed with the control signal $\Delta \Theta$ on lead 36 in summer 38 to produce a resultant signal $E_B$ on lead 46. Bias signal B2 on lead 44 is summed with the control signal $\Delta Z$ on lead 34 in summer 40 to produce a resultant signal $E_X$ on lead 48. The signals on leads 46 and 48 are applied to voltage controlled current sources 50 and 52 to produce control currents $I_1$ and $I_2$ on leads 54 and 56, respectively. Amplifiers 50 and 52 may be any of commercially available voltage-controlled power supplies capable of providing a dc output of the order of 0-10 amperes. The control currents on leads 54 and 56 are then applied to network 32. Current $I_1$ is applied to a shunt inductor 60 at the network input and current $I_2$ is applied to a series connected inductor 62 at the network output, as is to be described with respect to FIG. 5.

Figure 5:
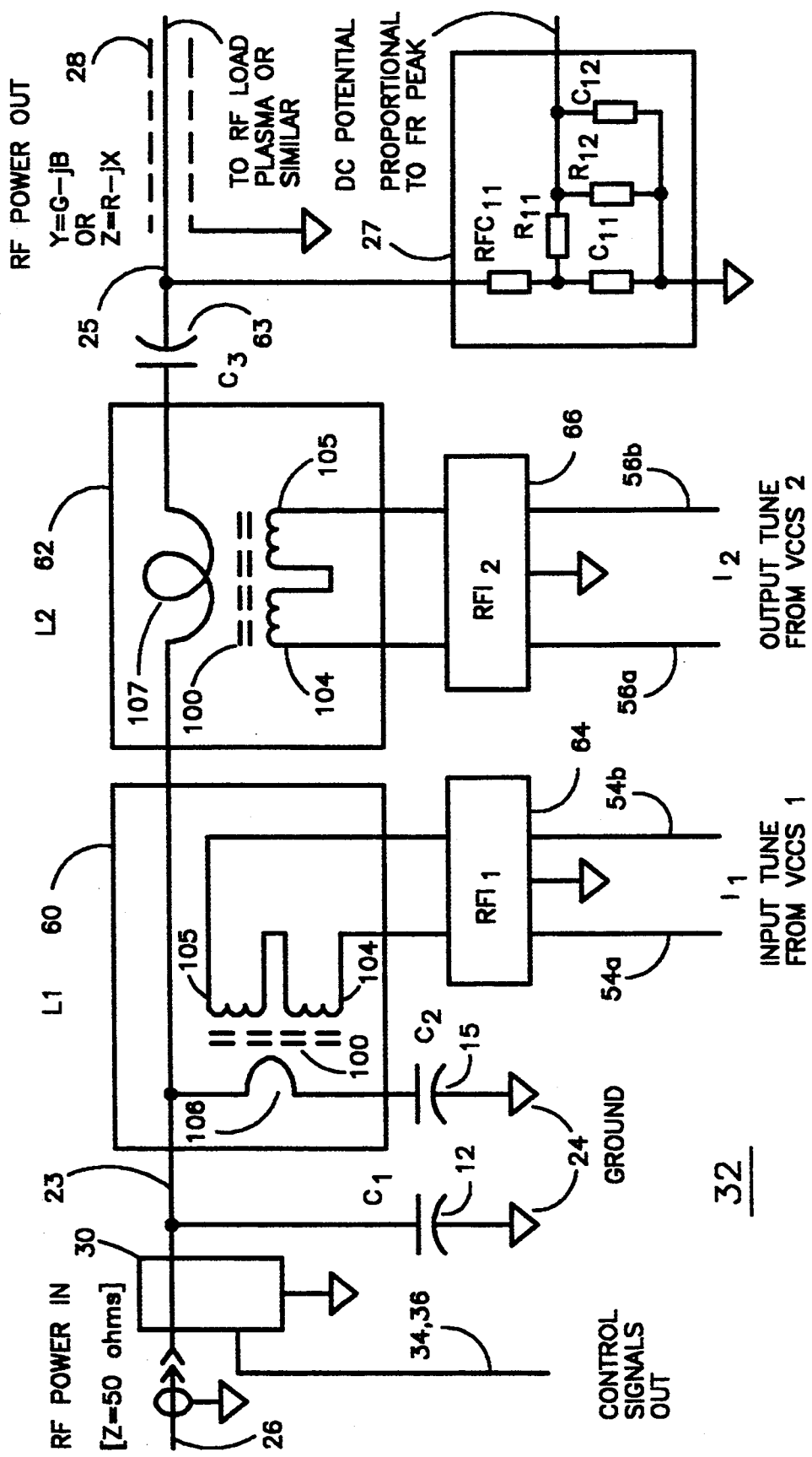
FIG. 5 is a schematic diagram showing a preferred embodiment of the inductors of the present invention as utilized in a matching network.

Referring now to FIG. 5 there is shown in schematic form the admittance network structure of the preferred embodiment. In this embodiment capacitors 12, 15, and 63 may all be fixed in value. It will be appreciated that fixed capacitors are more compact and less expensive than variable capacitors, and need no provisions for adjustment, once the initial values are computed or determined empirically. Since the nominal admittance of the plasma load is geometry and process dependent, some minimal experimentation may be required to determine optimal component values. Such determination is readily made by one skilled in the art by substituting commercially available stock high voltage rf capacitors. Shunt capacitor 12 is connected at a first end to the conductor 23, which is coupled to the input of network 32, and at a second end to ground plane 24. Similarly, shunt capacitor 15 is connected in series with an inductive coil 106 and distally connected to ground plane 24. Coil 106 is further connected to lead 23 to complete the rf energizing path.

An electronically variable inductor 60 is comprised of a ferrite core 100, a primary winding 106 coupled to lead 23 and capacitor 15, and a pair of dc magnetizing windings 104, 105. Windings 104 and 105 are coupled to receive dc current $I_1$ on leads 54a and 54b from voltage controlled current control source 50. Block 64 denotes a radio frequency interference filter $RFI_1$ connected between the magnetizing windings of inductor 60 and current control source 50.

In a similar manner, variable inductor 62 is provided with a multi-turn primary winding 107 coupled between the power source and the load, a core 100, and magnetizing windings 104 and 105. Block 66 represents filter $RFI_2$ and connects between the magnetizing windings of variable inductor 62 and current control source 52 via leads 56a and 56b, respectively. The case of filters 64 and 66 is connected to the ground plane 24.

Primary windings 106 and 107 are preferable formed from one continuous copper tubing and may be water cooled.

The output of winding 107 is connected in series with a fixed capacitor 63 to a center coductor 25, which feeds the plasma load 22 via transmission line 28. A conventional dc sampling network 27 may be used to provide a signal proportional to the peak rf output voltage for use during the plasma process.

Figure 6:
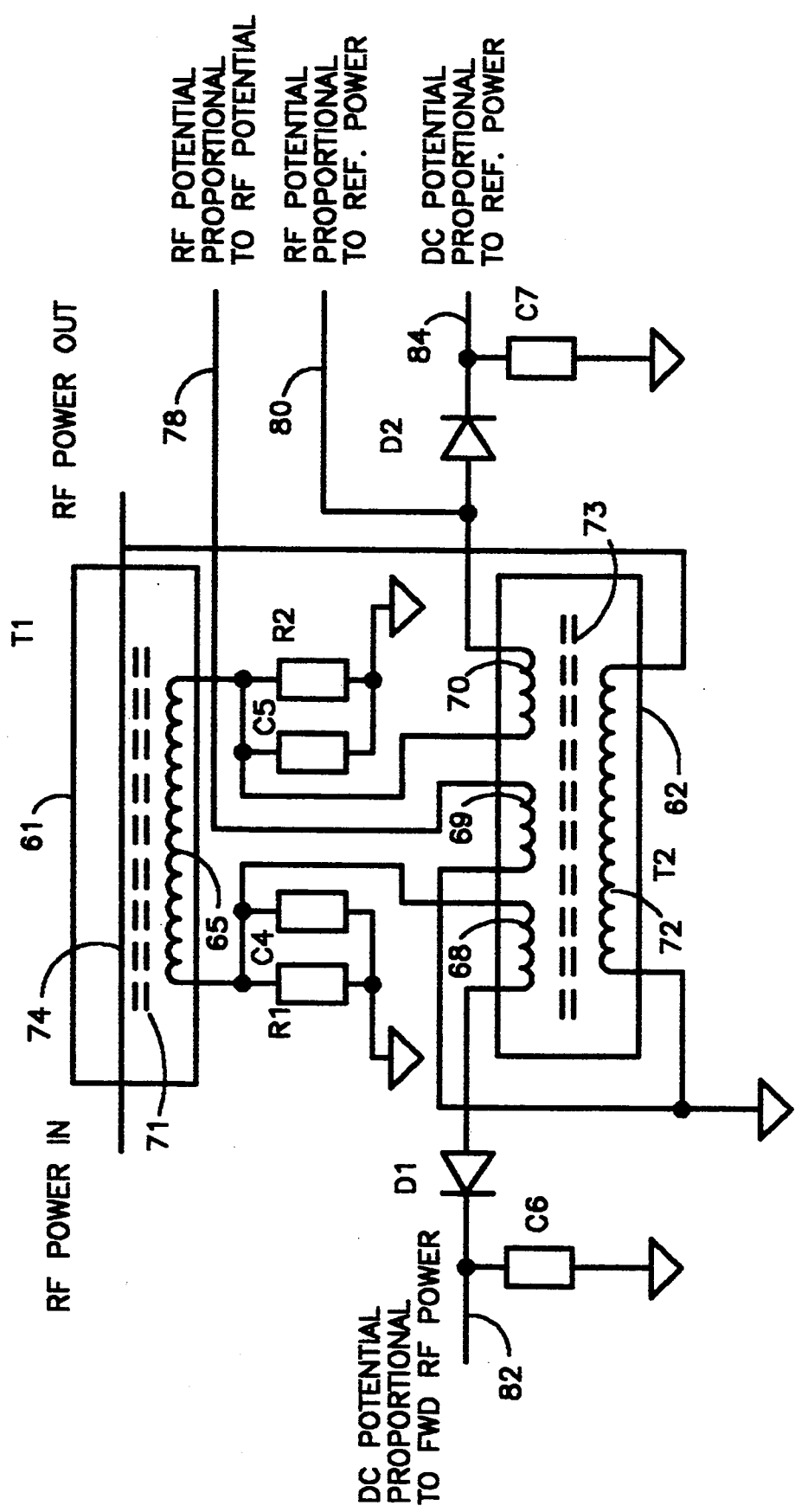
FIG. 6 is a circuit diagram of a directional coupler used for sensing an admittance mismatch condition.

FIG. 6 shows a schematic drawing of a directional coupler sensor as used in power monitor 30. It is comprised of a pair of toroidal transformers 61 and 62, diodes $D_1$ and $D_2$, resistors $R_1$ and $R_2$, and capacitors $C_4$-$C_7$. The transformer 61 is interposed in rf transmission line 74. The directional coupler samples the load's rf potential end currents. It provides forward and reflected rf and dc voltages proportional to forward and reflected power.

Transformer T2 has its' primary 73, connected to the rf output. It samples the rf potential; it has three secondaries, namely: 68, 69 and 70. The potential of winding 68 is added to the potential T1 winding 65 at the junction of R1 and C3. The resultant is an rf potential proportional to the rf forward power. This signal rectified by diode D1 and filtered by capacitor C 6 to yield a dc potential 82, proportional to P rf forward. The potential of winding 70 is added to the potential T1 winding 65 at the junction of R2 and C5. The resultant is an rf potential proportional to the rf reflected power. This signal is rectified by diode D2 and filtered by capacitor C7 to yield a dc potential 84, proportional to P rf reflected. The rf potential induced 78, in winding 69 is proportional load's rf potential. An rf voltage proportional to the reflected rf power on lead 80 and an rf voltage proportional to output voltage on lead 78 are processed in demodulator 30, shown in FIG. 5. The structure and operation of directional couplers is well known and described in detail in "An Inside Picture of Directional Couplers", W. B. Bruene, QST, April, 1959, pp. 24–28, which is hereby incorporated by reference.

Figure 7:
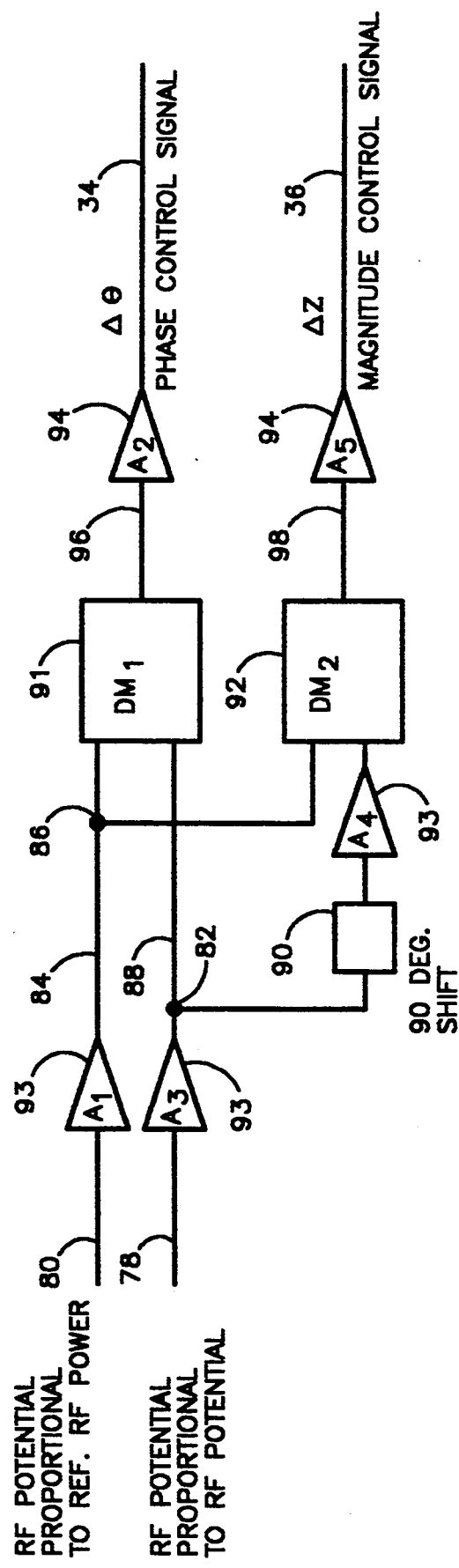
FIG. 7 is a block diagram of a demodulator as utilized in the present invention.

FIG. 7 shows a demodulator for providing the control signals $\Delta Z$ and $\Delta \Theta$. Input signals on leads 80 and 78 from the directional coupler are applied to amplifiers $A_1$ and $A_3$. The amplified signals on leads 84 and 88 are coupled to a synchronous demodulator $DM_1$. The output on lead 96 is amplified at $A_2$ and provides the control signal $\Delta \Theta$ on lead 34. The signal on lead 84 appears at node 86 and is coupled to an input of a second demodulator $DM_2$. The signal on lead 88 appears at node 82 and is coupled through a 90 degree phase shift network 90 to an amplifier 93 and thence to a second input of demodulator $DM_2$. The output thereof is applied on lead 98 to amplifier $A_5$ to provide control signal $\Delta Z$ on lead 36.

Referring again to FIG. 4, the output signals on leads 36 and 34 are summed with bias signals $B_1$ and $B_2$ by summers 38 and 40 to yield the control currents $I_1$ and $I_2$.

The structure and operation of balanced demodulators of this type are described in U.S. Pat. No. 4,493,112, "Antenna Tuner Discriminator", which is hereby incorporated by reference.

Figure 8:
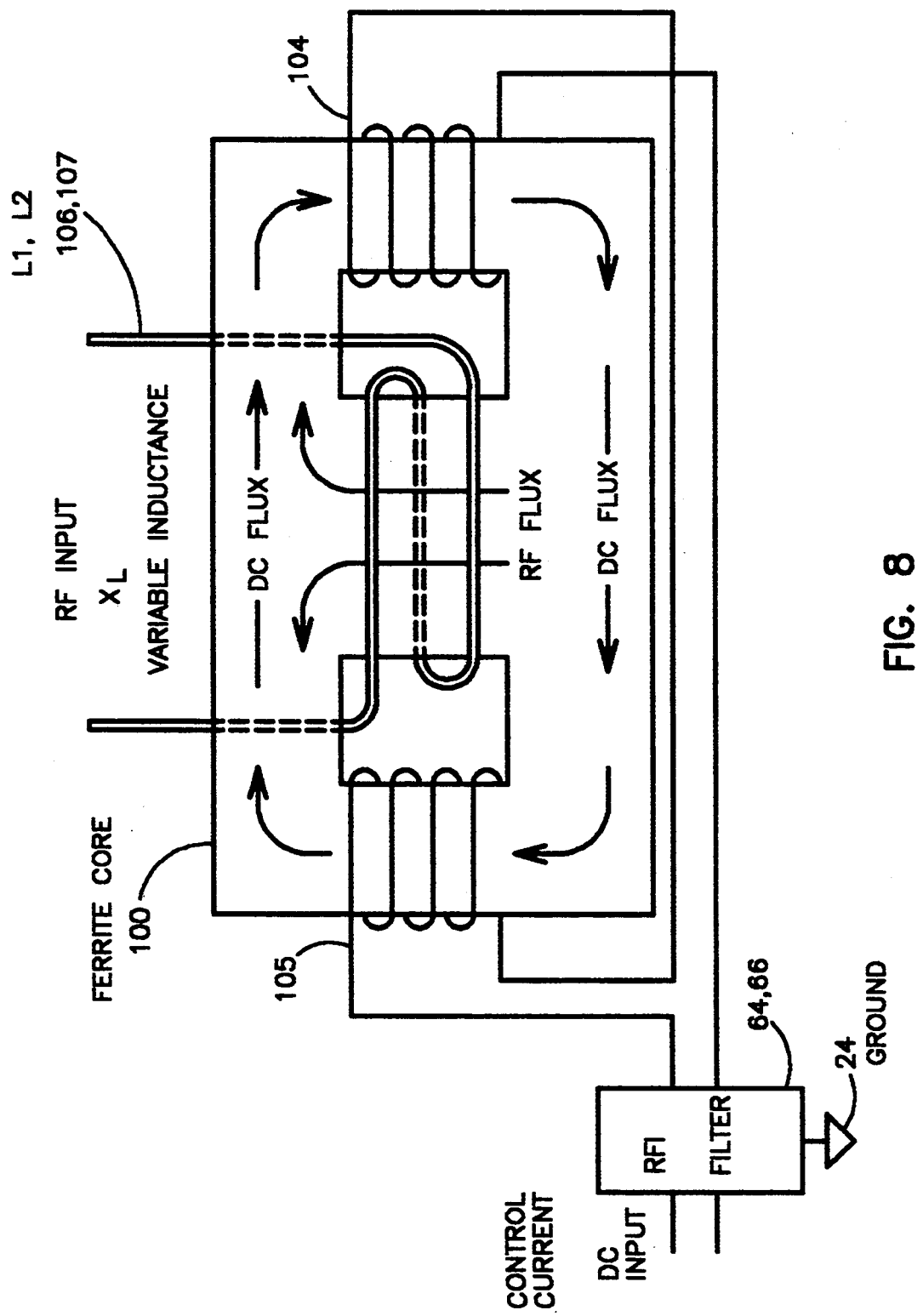
FIG. 8 is a schematic drawing of the wiring configuration of an inductor according to the present invention.
Figure 9:
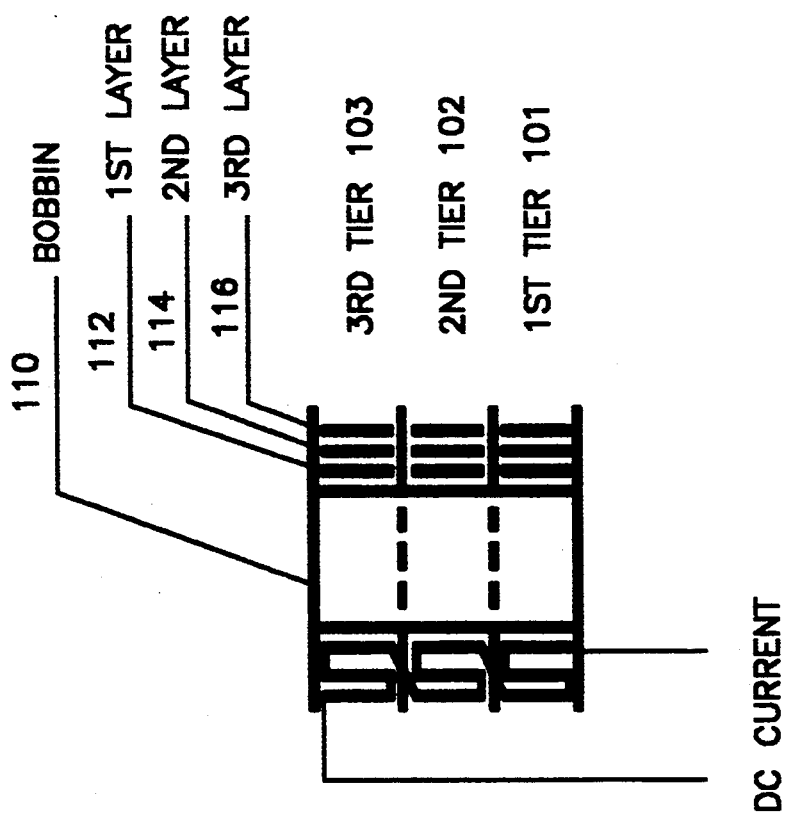
FIG. 9 shows a cross-sectional view of the energizing coil construction as utilized with the inductor of the preferred embodiment.

Referring now to FIG. 8, which is representative of inductors 60 and 62, an electronically variable impedance element is comprised of a pair of three-legged E core 100 of ferrite material, a single turn or multi-turn rf winding 106, 107 on the centrally disposed leg, and a pair of multi-layer, multi-turn windings 104, 105 respectively disposed on each of the outer legs. The windings 104 and 105 are connected in series aiding with respect to the dc magnetic flux induced in the core 100 and effectively in series opposing with respect to an rf flux induced in the core. Referring to FIG. 6, it can be seen that two of these variable inductors 100 are used in the apparatus. Namely Input Tune L1, 60 and Output Tune L2, 62. Inductors L1 and L.2 both use dc magnetizing windings 104 and 108 that are identical and are shown in FIG. 9. The rf coils are different for each inductor.

Rf coils 106, 107 are typically formed of a continuous length of silver-plated water cooled copper tubing, of the order of $\frac{1}{4}$ to $\frac{1}{2}$ inch diameter, to reduce rf losses and dissipate developed heat due to such losses. To accommodate the rf coil, the centrally disposed leg of the core is preferably machined to a circular contour. For an experimental model, an octagonal configuration was found suitable, and minimized fabrication costs. In production volume, the core would be cast in the preferred configuration.

An important aspect of the inductor structure is shown by the winding details of FIG. 9. Because of the large turns ratio between rf and dc magnetizing coils and the high power levels, the rf signal could induce extremely high voltages in the dc coil, which may lead to breakdown of the insulation and resulting failure of the inductor. The present invention is comprised of a bobbin 110 and a plurality of coaxial tiers 101, 102 and 103 of solenoid windings, wherein each tier is wound with an odd number of multilayer windings, 112, 114 and 116. This reduces the voltage differential between turns and layers, and facilitates interconnection, so that each of the tiers has a start and a finish termination, and the respective start and finish terminations of adjacent tiers are connected in series aiding. Each coil comprising the magnetizing winding is comprised of an odd number of coaxial tiers of multilayer windings. In an experimental model of the preferred embodiment, each magnetizing winding was comprised of three tiers and three layers.

Figure 11:
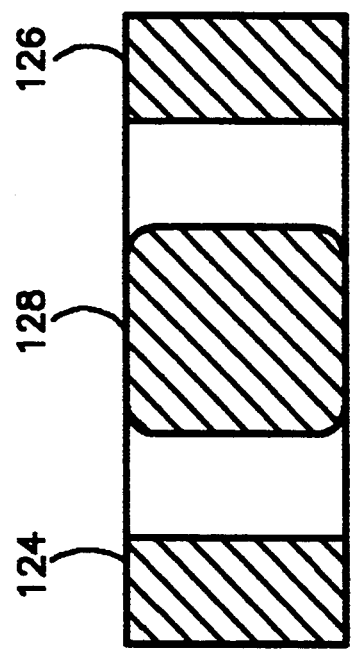
FIG. 11 is a cross-section through line 10—10 of the inductor core of FIG. 10.
Figure 13:
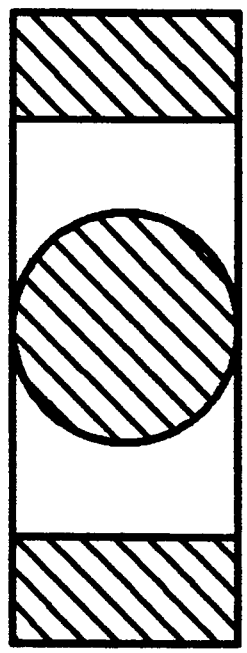
FIG. 13 is a view in section through line 12—12 of the inductor core of FIG. 12.
Figure 12:
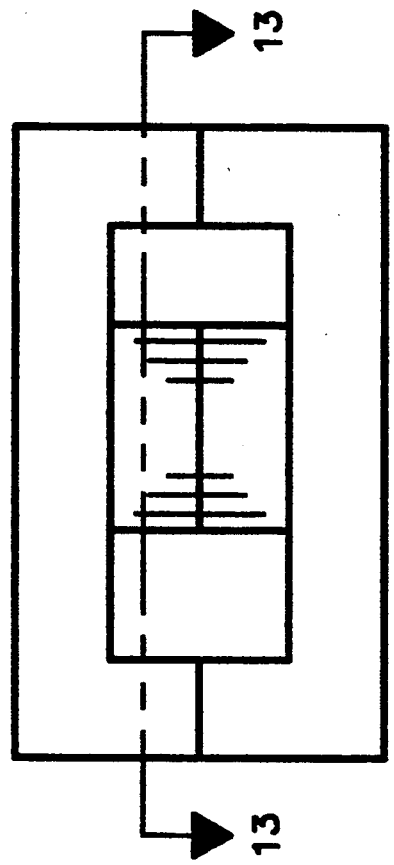
FIG. 12 is a view of a second exemplary embodiment of a monolithic inductor core with a center leg of round diameter.
Figure 15:
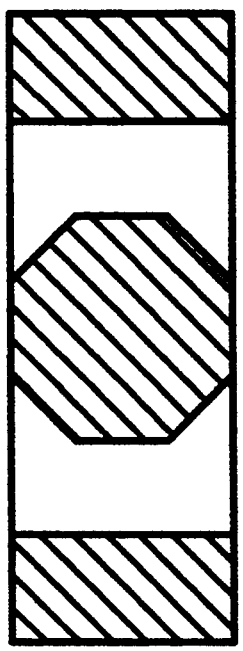
FIG. 15 is a view in section through line 14—14 of the inductor core of FIG. 14.
Figure 14:
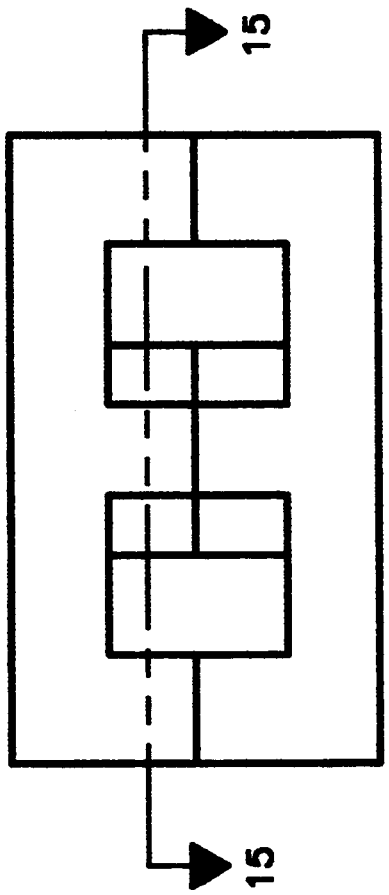
FIG. 14 is a view of a third exemplary embodiment of a monolithic inductor core having a center leg of octagonal cross-section.
Figure 17:
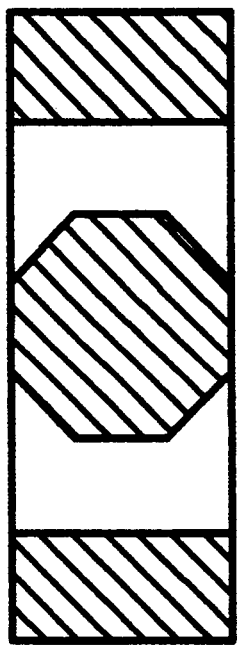
FIG. 17 is a view in section through line 16—16 of the core assembly of FIG. 16.
Figure 16:
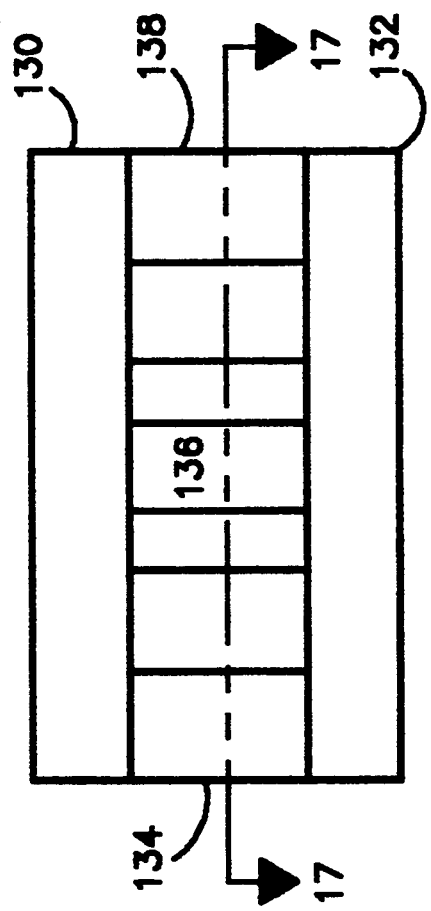
FIG. 16 is a view of an inductor core comprised of an assembly of linear members in the form of an E core, and having a center leg of octagonal cross section.
Figure 19:
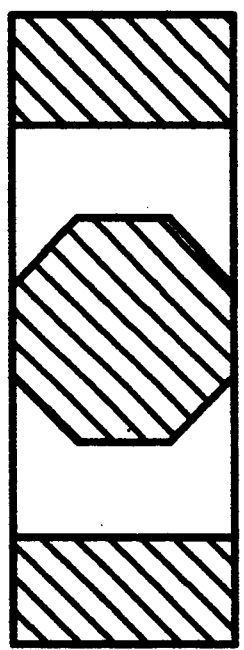
FIG. 19 is a view in section through line 18—18 of the core assembly of FIG. 18.
Figure 18:
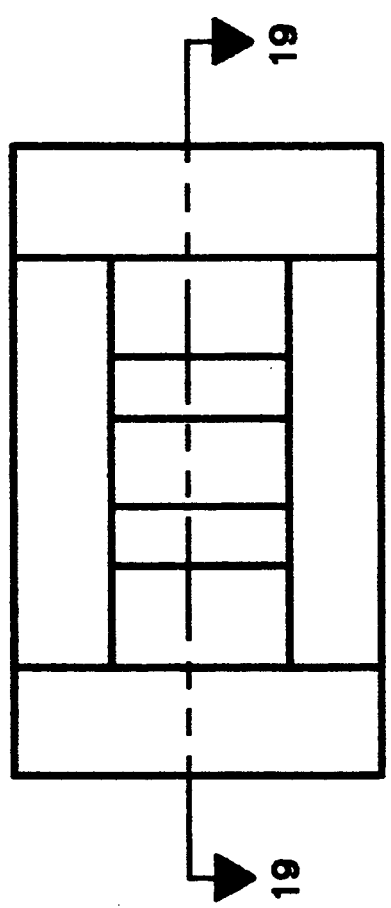
FIG. 18 is a view of a further embodiment of an inductor core comprised of an assembly of linear members in the form of an E core, and having a center leg of octagonal cross section.

A preferred core structure is shown in FIGS. 10–15. In FIG. 11 the center leg is seen to have substantially a square circumferential configuration. In FIG. 13 the center leg is formed to have a circular cross section, while FIG. 15 teaches an octagonal cross section, such configurations adapted to provide maximum coupling to the rf windings. Preferably, the core will be cast or machined as two identical monolithic "E" cores FIGS. 10, 12 and 14, or assembled from rectangular bars of a suitable material, as shown in FIGS. 16 and 18. When assembled from the cast or machined E cores, a set of two cores each measuring 6 inch in length, by 1.75 inch height, by 2 inch depth is useful for power levels up to one kw. For powers up to 3 kw, useful core dimensions are 8 inch long by 3 inch height by 3 inch depth.

A suitable material is comprised of Nickel Zinc ferrite, such as part number C2950 as manufactured by Ceramic Magnetics, Inc. Fairfield, N.J. 07004. Such a material has the following specifications, as shown in TABLE I, in MKS units:

TABLE I

| INDUCTOR CORE PARAMETERS | |
| --- | --- |
| Initial Permeability | 125 Henry/m |
| Maximum Permeability | 310 Henry/m |
| Saturation Flux Density | 2550 Tesla |
| Residual Flux Density | 1500 Tesla |
| Curie Temp. | 380° C. |
| Usable Frequency, | <20 Mhz |
| Actual Operating Freq. | 13.56 Mhz |

Figure 10:
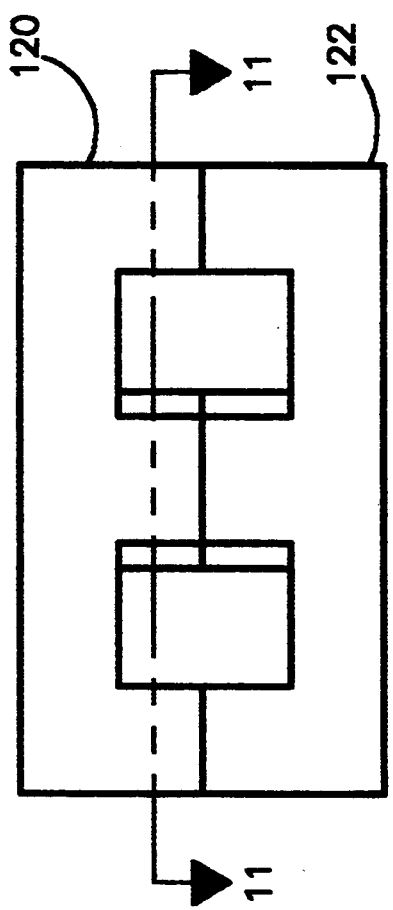
FIG. 10 is a view of an exemplary embodiment of a monolithic inductor core having a center leg of square configuration.

As shown in FIGS. 10 and 11, a preferred embodiment of the core assembly 120, 122 is provided with a central leg 128 for receiving an rf primary winding and outer legs 124, 126 for receiving the dc secondary windings. The central leg 128 may readily be machined to an octagonal circumference, as shown in FIG. 15, to more readily accept the rf winding, which is typically one or two turns of a copper tubing, as described above. Preferably, the central leg 128 will be cast in the form of a circular circumference, as shown in FIG. 13.

FIGS. 16–19 show an alternate preferred embodiment in which the core is comprised of longitudinal bars 130, 132 and connecting bars 134, 136, 138, assembled in the form of an E core. In this case, relatively little machining is required, and the central leg 136 is readily accessible for machining to any desired contour. Clearly, the assemblies shown are illustrative, and not limiting, as the desired overall configuration may be obtained, by assembling other stock ferrite bars of the specified or similar material. In all cases, the cross-sectional area of the central leg should be at least equal to the sum of the cross-sectional areas of the peripheral legs. The actual cross-sectional area is a direct function of the rf power level the network is designed to handle. Nominally, 4 sq. in. per kw is typical. Use of forced air and/or water cooling (via the tubular rf winding) is beneficial, in view of the deleterious effects of core heating.

The central leg of the core is host for the rf coil, yielding an inductance:

$$L = k\mu N^2 \text{ mH}$$

where N is the number of turns, $\mu$ is the permeability of the core, and k is a proportionality constant. The outer legs of the core are host to two identical dc magnetizing coils. The use of two dc coils serves a beneficial function, in that the dc fluxes are additive in the outer flux loop, thus maximizing permeability control, and the rf fluxes are subtractive, thus minimizing the induced rf potential in the RFI filters and the dc current control sources. The magnetizing coils are biased at a dc current yielding a predetermined magnetic based reluctance. As shown in TABLE II and TABLE III, by increasing or decreasing the applied dc current, the reluctance will vary in an inverse manner with the current.

TABLE II

ONE TURN RF WINDING ON FERRITE CORE
216 TOTAL TURNS DC SECONDARY

| Idc = Amp | HαNI | $X_L$ = ohms | $X_L$/50 | L = nH |
| --- | --- | --- | --- | --- |
| 0.1 | 21.6 | 61.4 | 1.23 | 720 |
| 2.0 | 432 | 28.4 | 0.57 | 333 |
| 4.0 | 864 | 17.8 | 0.36 | 208 |
| 6.0 | 1296 | 14.4 | 0.29 | 169 |
| 8.0 | 1728 | 12.7 | 0.25 | 149 |
| 10.0 | 2160 | 11.7 | 0.23 | 137 |

TABLE III

TWO TURN RF WINDING ON FERRITE CORE
216 TOTAL TURNS DC SECONDARY

| Idc = Amp | HαNI | $X_L$ = ohms | $X_L$/50 | L = μH |
| --- | --- | --- | --- | --- |
| 0.1 | 21.6 | 240 | 4.8 | 2.8 |
| 2.0 | 432 | 115 | 2.3 | 1.35 |
| 4.0 | 864 | 90 | 1.8 | 1.05 |
| 6.0 | 1296 | 73 | 1.46 | 0.86 |
| 8.0 | 1728 | 61 | 1.22 | 0.72 |
| 10.0 | 2160 | 52 | 1.05 | 0.61 |

Figure 20:
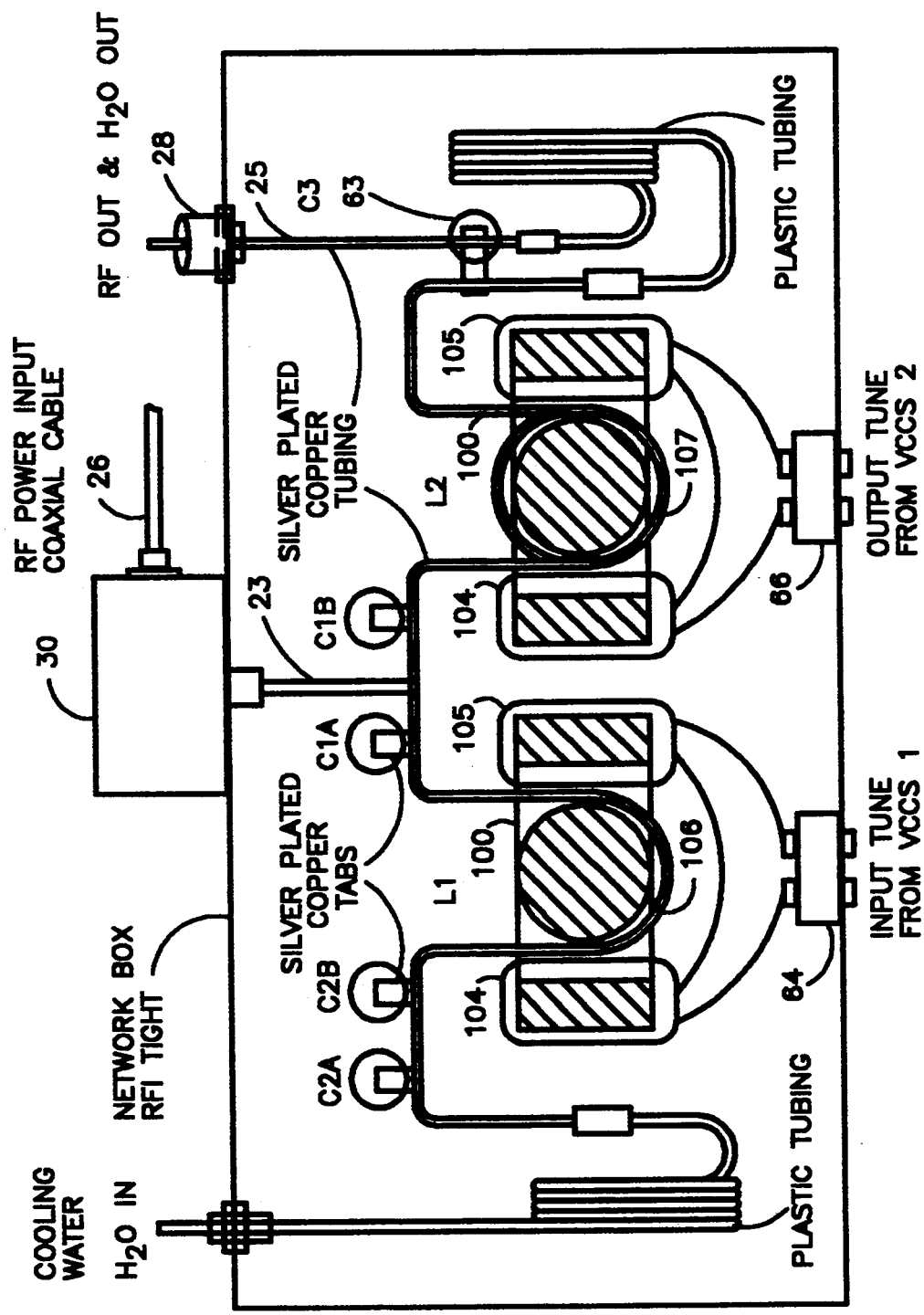
FIG. 20 is a pictorial plan view of the preferred embodiment of the invention.

FIG. 20 is a pictorial plan view of an experimental version of the invention, showing the placement of the network components. Radio frequency power is applied via rf conductor line 23 to a silver plated copper tubing, which forms the rf conductor for coils 106 and 107. A closed loop for water circulation through the tubing is provided by interconnected plastic tubing. The rf input power is shunted by a pair of capacitors C1A and C1B which form capacitor C1 of FIG. 5. Inductor L1 receives a portion of the rf energy through single turn winding 106 and is coupled to a core 100. Also coupled to core 100 are magnetizing windings 104, 105 which are energized by a dc source I1. Capacitors C2A and C2B form capacitor C2 of FIG. 5 and are series connected with winding 106 and terminated to the ground plane, formed by the metal casing of the apparatus. Inductor L2 receives a second portion of the applied rf energy through two-turn winding 107 which is coupled to an identical core 100. Winding 107 is series connected with capacitor C3 to conductor 25 and transmission line 28, and the output thereof is applied to the load. Not shown are the control circuits, which have been described in detail and are conventional in layout.

In operation, referring again to FIG. 4, the rf power from generator 10 is fed via rf transmission line 26 and power monitor/demodulator 30 to matching network 32 and high current transmission line 28 to the plasma load 22. Monitor-demodulator 30 senses forward and reflected voltage and power values and supplies control signals $\Delta\Theta$ and $\Delta Z$ to summers 38 and 40, where they are summed with bias voltages $B_1$ and $B_2$ respectively to produce control potentials $E_B$ and $E_X$. The signals on leads 46 and 48 drive voltage controlled current sources 50, 52 to provide control currents $I_1$ and $I_2$ on leads 54 and 56, respectively.

Referring to FIG. 5, the control currents are fed via RFI filters 64 and 66 to the dc control windings of variable inductors 60 and 62. As the dc control current is varied, the reluctance of the inductors is increased or diminished about the bias point until there is zero reflected power into the rf generator, indicating the admittance of the network 32 has been matched to the rf load 22. An admittance is achieved when the output admittance of the network 32 is the complex conjugate of the rf plasma or other type of load 22.

The magnetizing bias voltage sets the operating region on the B-H permeability curve to provide maximum dynamic range. Thus, referring to Table II, a nominal bias of 2–3 amperes would be suitable for the structure shown in the example. As the dc input current is increased, the permeability is reduced. Since the inductance and thus reactance of the inductor is directly proportional to the magnetic permeability of the core, an increase or decrease in dc current will result in a corresponding inverse change in the reactance of the inductor.

Figure 21:
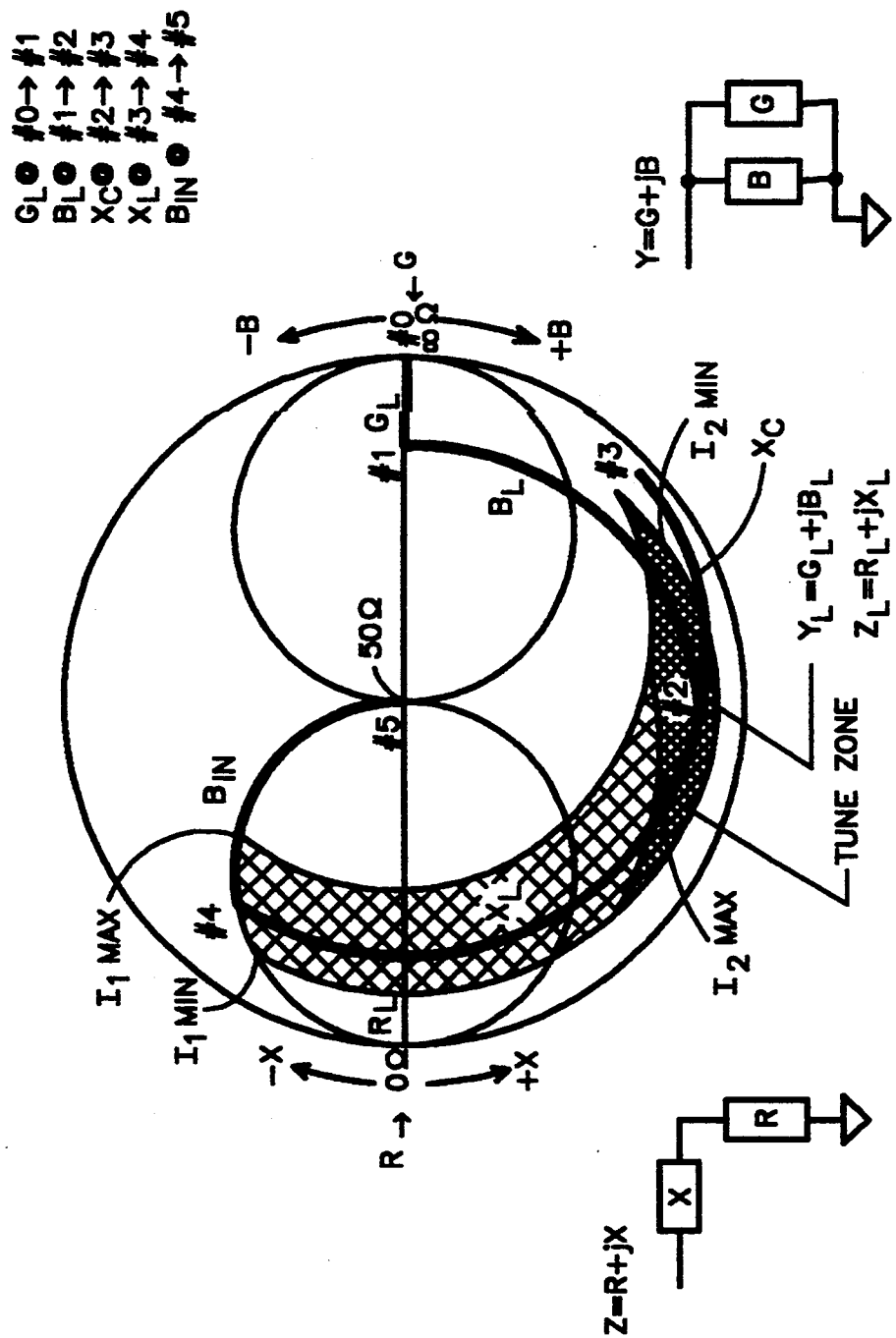
FIG. 21 is a Smith Chart useful in understanding the operation of the invention.

The Smith chart of FIG. 21 is helpful in understanding the operation of the network in achieving an admittance match. The horizontal axis is purely resistive, and ranges from 0 ohm on the left to $\infty$ ohm on the right.

The area above the horizontal axis represents a negative susceptance or reactance. The area below the horizontal line represents a positive susceptance or reactance. The geometric center of the circle represents unity, a point normalized for 50 ohm. This is the point of perfect admittance match.

The Smith chart graphically depicts the lump constant value of the components shown in FIG. 3 and the value of the network components required to achieve optimum tuning of admittance. Assuming a load conductance of $G_L$, from point #0 to point #1 brings the observer to point #1. The capacitive susceptance of $G_L$ leads on path $B_L$ to point #2. Capacitive reactance $X_C$ of the load and capacitor $C_3$ results in arriving at point #3. Retracing point #3 to point #4 indicates the inductive reactance $X_L$ of series inductor 62. The susceptance of capacitors $C_1$ and $C_2$ and the reactance of inductor 60 form the path $B_{IN}$ between points #4 and #5. Thus, the resulting admittance match is denoted by point #5, which is the 50 ohm optimum match point. While only one typical path is shown, other paths are possible within an effective tune range denoted by the shaded area. That is, point #2 can reside within these limits, and inductors 60 and 62 are tunable within this range to achieve perfect tune. This point can be expressed as an admittance $Y = G + jB$ or as an impedance $z = R + jX$.

While the invention has been described in its preferred embodiments, it is to be understood that the words which have been used are words of description rather than limitation, and that changes may be made within the purview of the appended claims without departing from the true scope and spirit of the invention in its broader aspects.

I claim:

1. Apparatus for dynamically matching a radio frequency signal source having a characteristic admittance to a load having a variable admittance, comprising:

an admittance matching network comprising a plurality of electronically variable impedance elements, said network having a first terminal coupled to said signal source and a second terminal coupled to said load and having an input responsive to a control current for varying an admittance of at least one of said plurality of variable impedance elements, power monitor means coupled between said signal source and said load, for providing first and second detected signals corresponding to rf power reflected from said load and rf output potential applied to said load, detection means, coupled between said power monitor means and said admittance matching network and responsive to said power monitor means, for providing signals respectively corresponding to a phase error and an amplitude error, said phase error signal and said amplitude error signal being representative of an admittance mismatch between said signal source characteristic admittance and said load admittance, and current control means coupled to receive said phase error and said amplitude error signals to provide dc control currents proportional thereto to said variable impedance elements, for adjusting said impedance elements so that said network provides a predetermined impedance coinciding with said signal source impedance at said first terminal of said network, said electronically variable impedance elements comprising at least one inductor having a closed core of ferromagnetic material, a first winding on a centrally disposed leg of said core coupled intermediate said signal source and said load, a plurality of coils respectively disposed on opposing legs of said core, said plurality of coils polarized so as to enhance an applied dc magnetic field in said core and so as to oppose induced rf currents coupled to said core and applied to said current control means, and having a plurality of winding layers coaxially disposed so as to minimize voltage differential between turns of said windings.

2. The apparatus as set forth in claim 1, said current control means further comprising means for applying a dc bias signal to determine a predetermined operating point on the hysteresis characteristic of said core, said operating point selected to provide an admittance variation corresponding to a range of admittance variation of said load, said bias signal being combined with said phase error signal or said amplitude error signal respectively to generate said dc control currents.

3. An apparatus as set forth in claim 1, further comprising a multiwinding E-core transformer, including at least first, second and third legs, said second leg being intermediate said first and third legs and having a cross-sectional area substantially equal to the sum of the cross-sectional areas of said first and second legs, said second leg having a circumferential contour adapted to receive a circular turn of said first winding, said first and third coils connected in series aiding with respect to a magnetic flux induced in said core, and effectively in series opposing with respect to a rf flux induced in said core.

4. An apparatus as set forth in claim 3, said first and third coils respectively comprised of a plurality of coaxial tiers of solenoidal windings, each said tier being comprised of an odd number of multilayer windings, each of said tiers having a start and a finish termination, and respective start and finish terminations of adjacent tiers being connected in series aiding.

5. An apparatus as set forth in claim 4, wherein each coil of said first and third legs is comprised of three coaxial tiers of solenoidal windings.

6. An apparatus as set forth in claim 5, wherein said core is comprised of ferrite material having a magnetic permeability of about 125 Henry/meter.

7. An apparatus as set forth in claim 6, wherein said core is comprised of a pair of opposing monolith E cores having a plurality of contacting faces corresponding to said first, second and third legs.

8. An apparatus as set forth in claim 6, wherein said core is comprised of an assembly of five legs, said first, second and third legs being sequentially disposed intermediate opposing fourth and fifth legs, said fourth and fifth legs respectively bridging opposing ends of said first, second and third legs so as to provide a complete magnetic path.

9. An apparatus as set forth in claim 3, wherein said circumferential contour comprises a plurality of planar faces.

10. An apparatus as set forth in claim 9, wherein said circumferential contour comprises a circle.

11. An apparatus as set forth in claim 9, wherein said circumferential contour comprises a polygon.

12. An apparatus as set forth in claim 9, wherein said circumferential contour comprises an ellipse.

13. An apparatus as set forth in claim 11, wherein said circumferential contour comprises a hexagon.

14. Apparatus for dynamically matching a radio frequency signal source having a characteristic admittance to a load having a variable admittance, comprising:

an admittance matching network comprising a plurality of electronically variable impedance elements, said network having a first terminal coupled to said signal source and a second terminal coupled to said load and having an input responsive to a control current for varying at least one of said plurality of variable impedance elements, power monitor means coupled between said signal source and said load, for providing first and second detected signals corresponding to rf power reflected from said load and rf output potential applied to said load, detection means, coupled between said power monitor means and said admittance matching network, for providing signals respectively corresponding to a phase error and an amplitude error, said phase error signal and said amplitude error signal being representative of an admittance mismatch between said signal source characteristic admittance and said load admittance, and current control means coupled to receive said phase error and said amplitude error signals to provide dc control currents proportional thereto to said variable impedance elements, for adjusting said impedance elements so that said network provides a predetermined impedance coinciding with said signal source impedance at said first terminal of said network, said electronically variable impedance elements comprising at least one inductor having a closed core of ferromagnetic material, a first winding on a centrally disposed leg of said core coupled intermediate said signal source and said load, a plurality of coils respectively disposed on opposing legs of said core, said plurality of coils polarized so as to enhance an applied magnetic field in said centrally disposed leg and so as to oppose induced rf currents coupled to said core and applied to said current control means, and having a plurality of winding layers coaxially disposed so as to minimize voltage differential between turns of said windings, said inductor further comprising a multiwinding E-core transformer, including at least first, second and third legs, wherein said core is comprised of a pair of opposing monolithic E-cores having a plurality of contacting faces corresponding to said first, second, and third legs, said second leg being intermediate said first and third legs and having a cross-sectional area at least equal to the sum of the cross-sectional areas of said first and second legs, said second leg having a substantially circular circumferential contour adapted to receive an arcuate turn of said first rf winding, said first and third coils connected in series aiding with respect to a magnetic flux induced in said core and effectively in series opposing with respect to a rf flux induced in said first and third legs, said first and third coils respectively comprised of at least three coaxial tiers of solenoidal windings, each said tier being comprised of an odd number of multilayer windings, each of said multilayer windings having a start and a finish termination, and respective start and finish terminations of adjacent tiers being connected in series aiding.

15. A method for electronically matching a radio frequency signal source having a characteristic admittance to a load having a variable admittance, comprising:

providing an admittance matching network comprising a plurality of electronically variable admittance elements, providing a control current for varying the admittance of at least one of said plurality of variable admittance elements, providing a current path through said variable admittance elements such that a closed, composite flux path is generated to enhance dc induced flux while diminishing rf induced flux, providing a voltage path through said variable admittance elements such that an applied control voltage is serially distributed over a plurality of coaxially disposed inductances, measuring the magnitude of rf reflected power and rf potential at said load and deriving signals corresponding thereto, applying said derived signals to synchronous demodulator means thereby to generate a phase error signal and an amplitude error signal corresponding to an admittance mismatch between said signal source and said load, providing a source of bias potential for adjusting the operating point of said variable impedance elements, applying said bias potential and said generated signals to a source of variable dc current, the amplitude of said variable dc current being representative of a disparity corresponding to said admittance mismatch, and applying said variable dc current to said variable impedance elements so as to urge said matching network to provide a substantially exact admittance match between said signal source and said load, whereby said phase error and said amplitude error signals are urged to a nullity.

16. An apparatus as set forth in claim 1, said core being comprised of an assembly of five legs, wherein first and second legs thereof are disposed in parallel and abut ends of third and fourth legs, also disposed in parallel, thereby defining a rectangle, a fifth leg thereof being disposed at a midpoint between said third and fourth legs to complete a magnetic flux path therebetween.

* * * * *